United States Patent [19]

Stewart

[11] 3,962,645
[45] June 8, 1976

[54] TONE FREQUENCY DETECTING CIRCUIT
[75] Inventor: David A. Stewart, Elnora, N.Y.
[73] Assignee: General Electric Company, Lynchburg, Va.
[22] Filed: Nov. 6, 1974
[21] Appl. No.: 521,460

[52] U.S. Cl. ............................... 325/478; 325/64; 328/138
[51] Int. Cl.² ...................................... H04B 1/16
[58] Field of Search ................... 325/51, 53, 55, 57, 325/64, 302, 364, 395, 396, 466, 478, 492; 307/233; 328/138, 140; 340/171 R, 171 A, 311; 343/225, 226, 228

[56] References Cited
UNITED STATES PATENTS

| 3,537,001 | 10/1970 | Friend | 324/78 |
| 3,578,919 | 5/1971 | O'Neill | 179/84 |
| 3,633,112 | 1/1972 | Anderson | 325/478 |
| 3,684,965 | 8/1972 | Gautney et al. | 325/64 |

Primary Examiner—Benedict V. Safourek
Assistant Examiner—Marc E. Bookbinder
Attorney, Agent, or Firm—James J. Williams

[57] ABSTRACT

In some radio communication systems, a tone of selected frequency (usually below the voice frequency) is transmitted so as to activate only selected radio receivers in the system. Each of such radio receivers is provided with a circuit for detecting a selected tone frequency. The detecting circuit includes means for producing sequences of pulses at a rate N times higher than the selected tone frequency, so that each sequence contains one through N numbered pulses for each cycle of tone. A selected portion of each cycle of tone of desired frequency coincides with the same pulses of each sequence, and these coincidences produce vectors of the same angular phase (corresponding to the pulse numbers). If the sum of a plurality of such vector outputs exceeds a certain threshold level, an output signal is produced to indicate that the proper tone frequency is received, and this output signal can activate the receiver. The selected portion of each cycle of tone of undesired frequency causes coincidences with different pulse numbers in each sequence, and these coincidences produce vectors of different phases, so that the vector sum does not reach the needed threshold level for receiver activation.

11 Claims, 11 Drawing Figures

FIG.1

| CHANNEL NO. | CHANNEL TONE FREQ. | DIVISOR ENTRY | PULSES PER SECOND | RESULTANT FREQUENCY |
|---|---|---|---|---|
| 1 | 71.9 | 1030 | 1150.66 | 71.92 |
| 2 | 77.0 | 962 | 1232.00 | 77.00 |
| 3 | 82.5 | 898 | 1319.80 | 82.49 |
| 4 | 88.5 | 837 | 1415.99 | 88.50 |
| 5 | 94.8 | 781 | 1517.52 | 94.85 |
| 6 | 100.0 | 741 | 1599.44 | 99.96 |
| 7 | 103.5 | 716 | 1655.28 | 103.46 |
| 8 | 107.2 | 691 | 1715.17 | 107.20 |
| 9 | 110.9 | 668 | 1774.22 | 110.89 |
| 10 | 114.8 | 645 | 1837.49 | 114.84 |
| 11 | 118.8 | 624 | 1899.33 | 118.71 |
| 12 | 123.0 | 602 | 1968.74 | 123.05 |
| 13 | 127.3 | 582 | 2036.40 | 127.27 |
| 14 | 131.8 | 562 | 2108.87 | 131.80 |
| 15 | 136.5 | 543 | 2182.66 | 136.42 |
| 16 | 141.3 | 524 | 2261.80 | 141.36 |
| 17 | 146.2 | 507 | 2337.64 | 146.10 |
| 18 | 151.4 | 489 | 2423.69 | 151.48 |
| 19 | 156.7 | 473 | 2505.67 | 156.60 |
| 20 | 162.2 | 457 | 2593.40 | 162.09 |
| 21 | 167.9 | 441 | 2687.49 | 167.97 |
| 22 | 173.8 | 426 | 2782.12 | 173.88 |
| 23 | 179.9 | 412 | 2876.66 | 179.79 |
| 24 | 186.2 | 398 | 2977.85 | 186.12 |
| 25 | 192.8 | 384 | 3086.42 | 192.90 |
| 26 | 203.5 | 364 | 3256.00 | 203.50 |

| COUNTER AND LATCH OUTPUTS | VECTOR | ANGLE | X COMPONENT | Y COMPONENT |
|---|---|---|---|---|
| 0000 | 1 | 0° | +1.0000 | 0.0000 |
| 0001 | 2 | 22.5° | +0.9239 | +0.3827 |
| 0010 | 3 | 45.0° | +0.7071 | +0.7071 |
| 0011 | 4 | 67.5° | +0.3827 | +0.9239 |
| 0100 | 5 | 90.0° | 0.0000 | +1.0000 |
| 0101 | 6 | 112.5° | -0.3827 | +0.9239 |
| 0110 | 7 | 135.0° | -0.7071 | +0.7071 |
| 0111 | 8 | 157.5° | -0.9239 | +0.3827 |
| 1000 | 9 | 180.0° | -1.0000 | 0.0000 |
| 1001 | 10 | 202.5° | -0.9239 | -0.3827 |
| 1010 | 11 | 225.0° | -0.7071 | -0.7071 |
| 1011 | 12 | 247.5° | -0.3827 | -0.9239 |
| 1100 | 13 | 270.0° | 0.0000 | -1.0000 |
| 1101 | 14 | 292.5° | +0.3827 | -0.9239 |
| 1110 | 15 | 315.0° | +0.7071 | -0.7071 |
| 1111 | 16 | 337.5° | +0.9239 | -0.3827 |

| COUNTER OUTPUT | VECTOR | VECTOR REVERSAL CIRCUIT OUTPUT | |
|---|---|---|---|
| | | LIMITER OUTPUT HIGH | LIMITER OUTPUT LOW |
| 0000 | 1 | 9 | 1 |
| 0001 | 2 | 10 | 2 |
| 0010 | 3 | 11 | 3 |
| 0011 | 4 | 12 | 4 |
| 0100 | 5 | 13 | 5 |
| 0101 | 6 | 14 | 6 |
| 0110 | 7 | 15 | 7 |
| 0111 | 8 | 16 | 8 |
| 1000 | 9 | 1 | 9 |
| 1001 | 10 | 2 | 10 |
| 1010 | 11 | 3 | 11 |
| 1011 | 12 | 4 | 12 |
| 1100 | 13 | 5 | 13 |
| 1101 | 14 | 6 | 14 |
| 1110 | 15 | 7 | 15 |
| 1111 | 16 | 8 | 16 |

FIG.9

TONE FREQUENCY DETECTING CIRCUIT

BACKGROUND OF THE INVENTION

My invention relates to a tone frequency detecting circuit, and particularly to a tone frequency detecting circuit for detecting the frequency of an audio tone transmitted in a radio communication system.

In some radio communication systems, it may be desirable or necessary that some transmission on a particular radio carrier frequency be heard only by a selected receiver or receivers, and that some other transmissions on the same particular radio carrier frequency be heard only by a different selected receiver or receivers. Such a system is sometimes referred to as a channel guard system. In such systems, an audio tone of selected frequency is transmitted along with but outside the range of the information or voice frequencies. The particular frequency of the audio tone is used to render selected radio receivers operative or activated so that only those receivers sensitive to the frequency of the audio tone reproduce the information transmitted with the tone, and so that all other radio receivers remain inoperative or inactivated. Thus, more effective use can be made of a single radio carrier frequency, and some privacy can still be provided.

Radio industry standards have established 26 different audio tone frequencies between 71.9 and 203.5 hertz for use in such systems. This means that the average frequency separation of adjacent tones is approximately 5.3 hertz. Hence, the frequency detecting circuit should be very selective or narrow in its response. If the frequency detecting circuits use physical inductors and capacitors, such circuits are very large and heavy.

Accordingly, a primary object of my invention is to provide a new and improved tone frequency detecting circuit, particularly for use in tone actuated radio receivers.

Another object of my invention is to provide a new and improved tone frequency detecting circuit that can accurately detect a selected audio tone having a relatively low frequency and having relatively little frequency separation between adjacent audio tones.

Another object of my invention is to provide a new and improved tone frequency detecting circuit that can detect a relatively low frequency audio tone but that can be in the form of relatively small and light microelectronic circuits.

SUMMARY OF THE INVENTION

Briefly, these and other objects are achieved in accordance with my invention by a pulse generator which produces sequences of N pulses per sequence, the sequence frequency being the same as the selected tone frequency to be detected. Coincidence means detect which pulse numbers of each sequence coincide with portions of each cycle of tone, and produce a vector having a phase indicative of each of the coincidences. The vectors so produced are added, and if their sum exceeds a threshold level, an output signal is produced to indicate detection of the selected tone frequency. However, different pulse numbers in each sequence will coincide with portions of each cycle of improper tone frequencies to provide different vectors whose phases will not add up to the threshold level. Thus, a tone of proper frequency will be detected to activate a receiver.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF A PREFERRED EMBODIMENT

Figure 1:
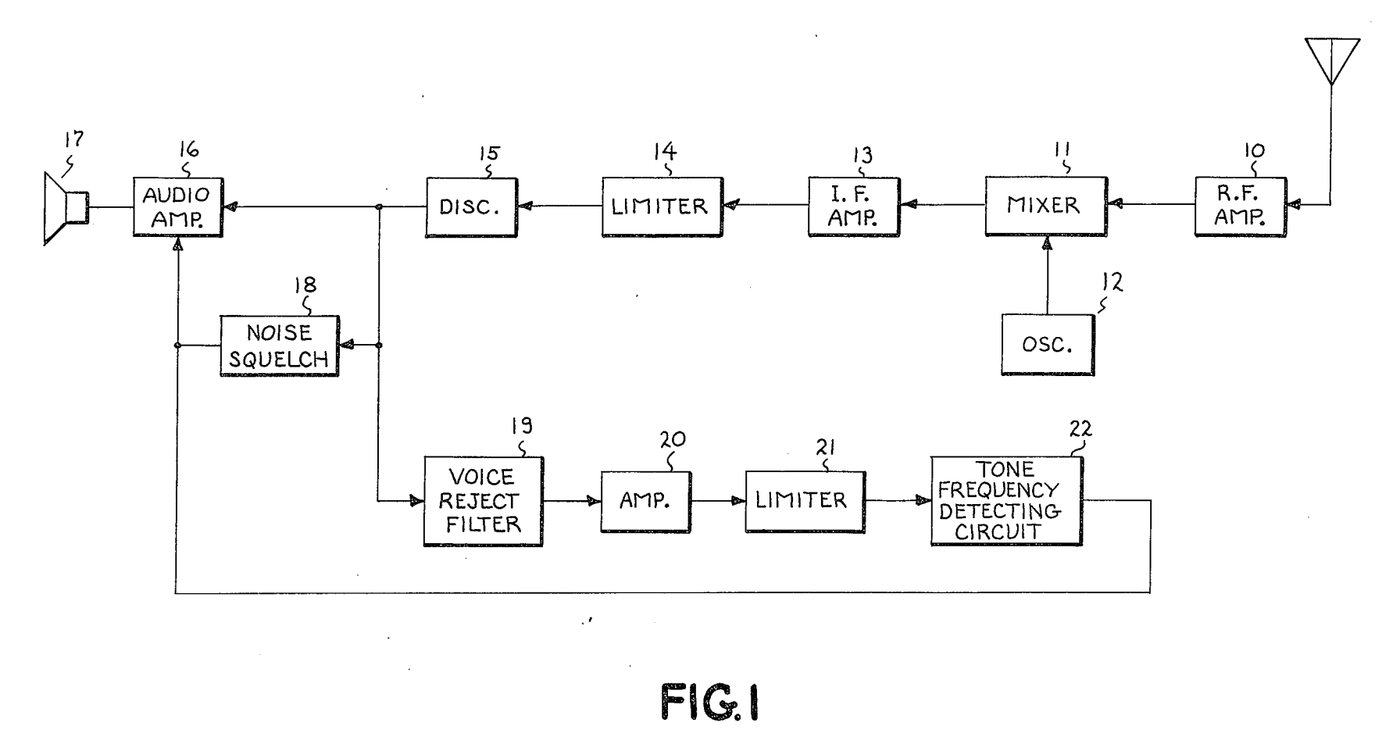
FIG. 1 shows a block diagram of a known radio receiver that is activated by a tone frequency detecting circuit.

FIG. 1 shows a block diagram of a known frequency modulation radio receiver that is activated by a tone frequency detecting circuit. I have selected a frequency modulation receiver because such receivers are typically used with a continuous tone control radio system. However, it is to be understood that it may be possible to use my invention with other types of receivers. The receiver of FIG. 1 includes an antenna for receiving the frequency modulated signals. These signals are supplied to a radio frequency (RF) amplifier 10, and the amplified signals are supplied to a mixer 11. The mixer 11 receives signals from an oscillator 12 to produce intermediate frequency (IF) signals which are amplified in an IF amplifier 13 and supplied to an amplitude limiter 14. The amplitude limited signals are applied to a detector or discriminator 15. The detected signals are supplied to an audio amplifier 16 and are utilized in any suitable way, such as by a loudspeaker 17. Where, as contemplated here, the information signals are also provided with a continuous tone during transmission of the information signals, the audio amplifier 16 includes a tone reject filter which blocks the tone frequencies, generally below 250 hertz, so they will not be supplied to the loudspeaker 17. The discriminator 15 also provides the audio signals to a noise squelch circuit 18. The noise squelch circuit 18 typically includes a noise filter network which has a passband above the audio frequency band, and which produces a squelch signal whenever the received noise level rises above a selected threshold because of the absence of an information signal. This squelch signal is applied to an appropriate point in the audio amplifier 16 to squelch or mute the audio amplifier 16 in response to noise. However, when a carrier signal with information is received, the noise squelch circuit 18 produces an unsquelch signal which opens the audio amplifier 16 so that information signals can be received.

In a continuous tone control radio system, it is desirable or necessary, from either the standpoint of privacy or frequency conservation, to make selected radio receivers responsive only to certain transmission on a given carrier frequency, although other receivers in the system may receive that same carrier frequency. This is achieved by the use of a continuous tone transmitted along with the information signals, but typically at frequencies below the information signals. In the case of the system providing radio telephone communication, the continuous tone transmitted is at a selected frequency generally in the range between 60 and 250 hertz. The particular tone frequency transmitted renders only selected radio receivers operative, since such selected receivers are arranged to be responsive to that particular tone frequency. Such receivers usually require an unsquelch signal from the noise squelch circuit 18 as well as reception of tone of the proper frequency in order that the audio amplifer can be unsquelched and information (usually voice) signals can be heard. To activate the receiver in response to a tone, the discriminator 15 also supplies the audio signals to a voice reject filter 19 which is a low pass filter that rejects the voice frequencies (generally above the assumed 250 hertz), and passes only the low frequency tones. The tone frequencies are amplified in an amplifier 20, amplitude limited in a limiter 21, and supplied to a tone frequency detecting circuit 22. In tone actuated receivers, this circuit 22 must have a very narrow passband (such as plus or minus 0.5 percent, which would amount to several hertz) in order to insure that the receiver response only to the desired tone frequency. This circuit 22 produces an activating signal in response to the desired tone frequency, and this activating signal is applied to the audio amplifier 16 in addition to the signal from the noise squelch circuit 18. In such receivers, it is usually preferable that both the unsquelch signal from the noise squelch circuit 18 and the activating signal from the circuit 22 be present before the receiver can produce audio signals.

Figure 2:
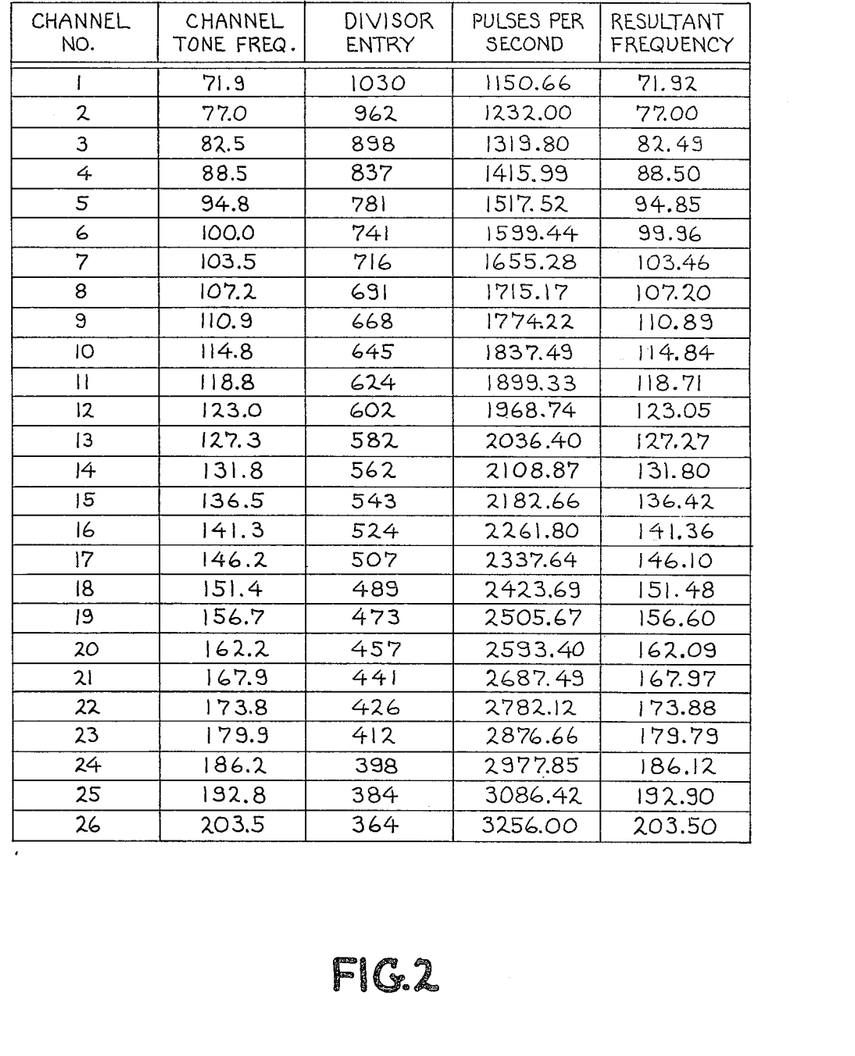
FIG. 2 shows a table illustrating one set of industry standards for audio tone frequencies, and selected signals produced in accordance with my invention for that set of standards.

FIG. 2 shows a table of one set of standard tone frequencies which are used in tone operated radio communication systems. The first column shows 26 designated channel numbers for such a system. Typically, such systems do not utilize or transmit voice or information frequencies below around 300 hertz, so that these frequencies are available for tones. The second column of FIG. 2 shows the designated tone frequencies for each of the 26 channels. This set of frequencies begins at 71.9 hertz for channel 1 and continues through 203.5 hertz for channel 26. The communication system transmits selected tones corresponding to the particular channel numbers, and receivers in the system are arranged to be activated or operated in response to reception of the designated tones for those receivers. In FIG. 2, it will be seen that the tones of adjacent channels are closely spaced in frequency. This close spacing requires very selective filtering which, if provided by inductors and capacitors at these low audio frequencies, would be very large and heavy. Accordingly, it is desirable to provide a tone frequency detecting circuit that is relatively small and that can reliably activate a radio receiver in response to only its one designated tone frequency.

Figure 3:
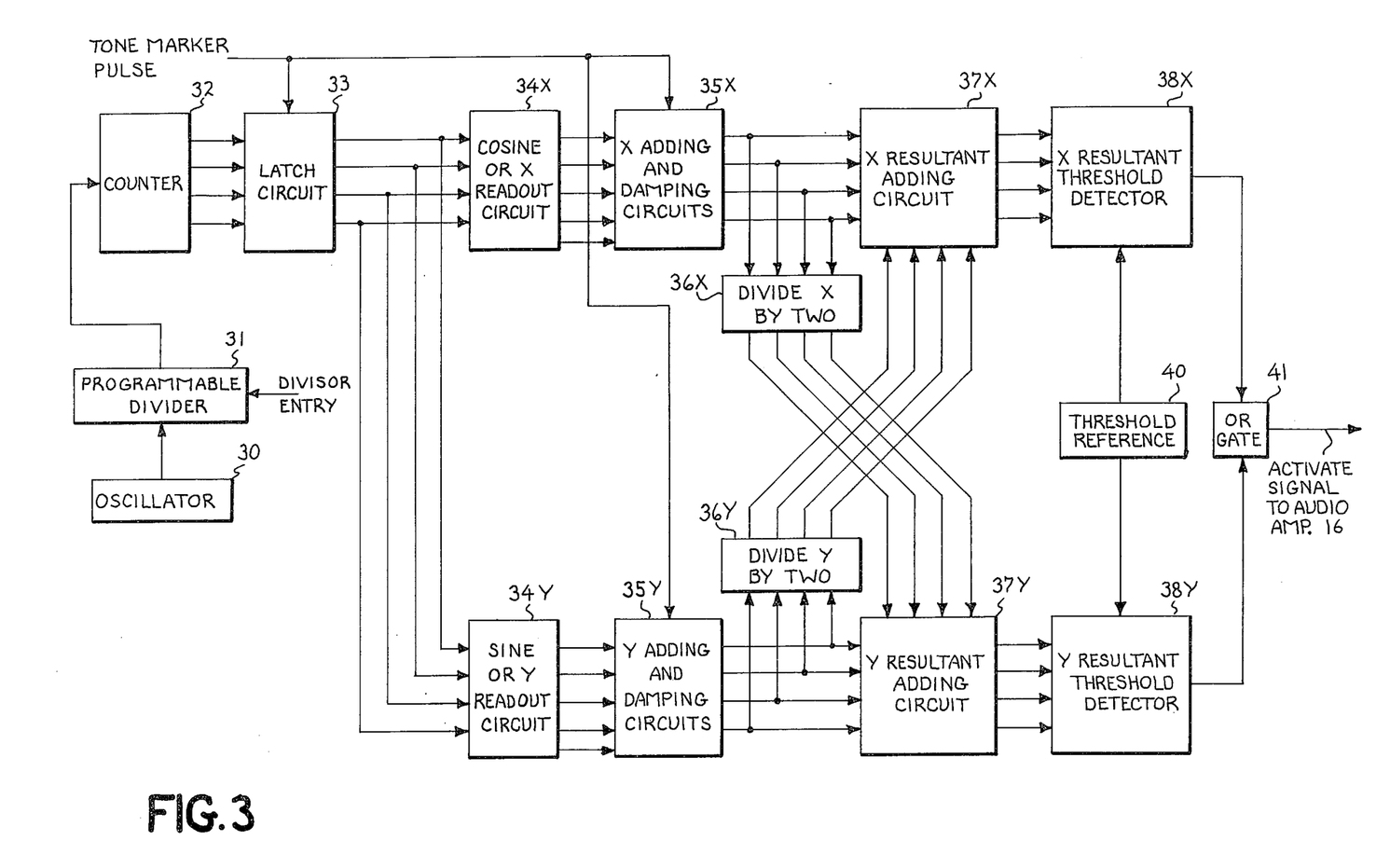
FIG. 3 shows a circuit diagram of a tone frequency detecting circuit in accordance with my invention.

FIG. 3 shows a circuit diagram of a digital tone frequency detecting circuit 22 in accordance with my invention for enabling a radio receiver (such as shown in FIG. 1), as well as other apparatus, to be activated by a tone frequency (such as shown in FIG. 2). One feature of my invention is the production of repetitive sequences of pulses, each sequence having N pulses for each cycle of the selected channel tone frequency. I have selected N to be 16 as the number of pulses per sequence because of the digital circuits used. However, it will be understood that other numbers of pulses per sequence (or per tone cycle) can be produced. With reference to FIG. 2, if a receiver is to be responsive to channel 2 (whose tone frequency is 77.0 hertz), for example, then 16 times 77 or 1232 pulses per second will be produced for the channel 2 tone frequency. However, it is also desirable that my tone frequency detecting circuit be operable with any one of the 26 channel tone frequencies. With the number N being 16 pulses per cycle of channel tone frequency, I determined that an oscillator operating at 1,185,184 hertz (or some integral multiple thereof), after having its frequency divided by an integral divisor, provides 16 pulses for each cycle of any of the 26 channel tone frequencies shown in FIG. 2. With reference to FIG. 3, an oscillator 30 operating at a frequency of 1,185,184 hertz is provided. The oscillator output is applied to a programmable divider 31 which may take the form of any known digital dividing circuits. The divider 31 has an entry input for a divisor which divides the incoming pulses by this divisor. The third column of FIG. 2 shows the divisor entries (which are integers) that can be used with the oscillator frequency of 1,185,184 hertz to provide the 16 pulses for each cycle of tone frequency. The fourth column of FIG. 2 shows the number of pulses per second which are produced by the programmable divider 31 when the oscillator frequency of 1,185,184 hertz is divided by the various divisor entries. With respect to channel 2, for example, if the oscillator frequency is divided by 962, then 1232 pulses per second are produced. This results in 16 pulses per each cycle of the corresponding channel 2 tone frequency of 77 hertz. The actual resultant frequency provided by my oscillator frequency of 1,185,184 and the various divisor entries is shown in the fifth column of FIG. 2. In this regard it will be noted that the resultant frequencies are very close to the actual standard channel tone frequencies. If desired, a fixed frequency repetitive pulse generator can be used in place of the oscillator 30 and programmable divider 31 to produce repetitive pulse sequences each having 16 pulses per cycle of the desired tone frequency.

Figure 4:
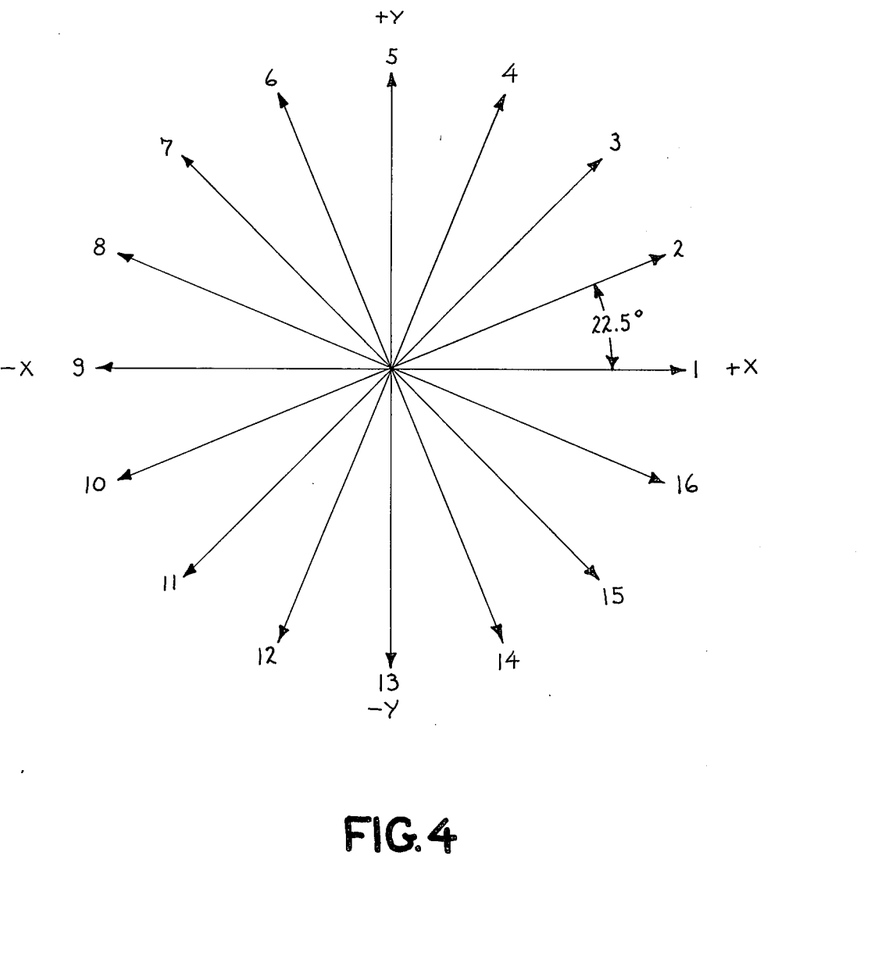
FIG. 4 shows a vector diagram illustrating the operation of a tone frequency detecting circuit in accordance with my invention.

The pulses produced by the programmable divider 31 (or a fixed frequency pulse generator if used) are applied to a four output binary counter 32 which is known in the art. The counter outputs have 16 binary states from 0000 to 1111 in response to the applied pulses. These 16 states are illustrated in the first or left column of FIG. 5, and as will be explained, represent 16 different phase vectors as shown in FIG. 4. The four outputs of the counter 32 are applied to a four input latch circuit 33 which is also known in the art. The latch circuit 33 has four binary outputs which take the same logic state as the four binary inputs when a latch signal is applied. This latch signal is a tone marker pulse derived by a suitable circuit (not shown) from the tone signal supplied by the limiter 21 of FIG. 1, so that the marker pulse occurrence indicates the frequency of the tone. The latch signal should be a relatively narrow pulse, in the order of 10 microseconds, and may be produced at a suitable but identical time point in each cycle of the tone signal. From the standpoint of convenience and accuracy, I prefer that the time point be each zero crossing of the tone signal in a positive direction. When this latch signal is applied to the latch circuit 33, it causes the four outputs of the latch circuit 33 to assume the logic condition of its four inputs, and to maintain this condition until another latch signal is applied. With respect to FIG. 3, one such latch signal will be applied once during each cycle of the tone frequency. Thus, the latch circuit 33 produces a binary number corresponding to the pulse number in each sequence that coincides with the selected time point in each cycle of the tone marker pulse.

Figure 5:
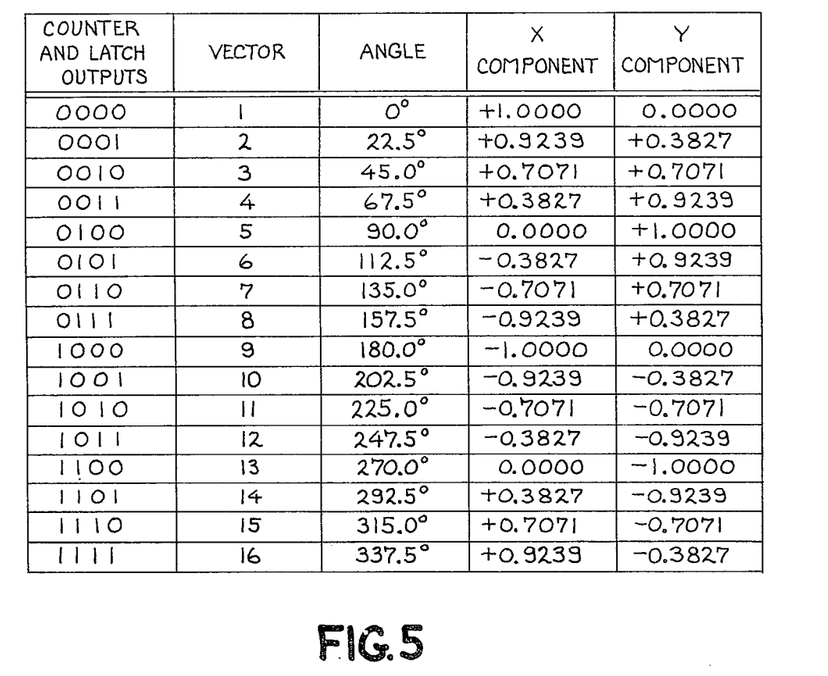
FIG. 5 shows a table illustrating certain functions of a tone frequency detecting circuit in accordance with my invention.

The pulse number in each sequence that coincides with the time occurrence of the tone marker pulse is converted to information representing a respective one of 16 angular vectors shown in FIG. 4. These vectors have equal magnitudes and are equally spaced 22.5° apart. I have arbitrarily designated vector 1 as being at zero degrees (or along the +X axis). The vector numbers increase in a counterclockwise direction to vector 16 at 337.5°. While it is possible to manipulate these vectors in various ways, I prefer to resolve the vectors into their cosine (or X) components and their sine (or Y) components. Such components can be added or subtracted numerically, and a resultant obtained relatively easily. In order to handle these components, I provide a cosine or X readout circuit 34X and a sine or Y readout circuit 34Y. These circuits 34X, 34Y are simply memories which produce an output representative of the cosine and sine values called for by their inputs. Five lines are shown at the outputs of the readout circuits 34X, 34Y. Four of these lines represent (in binary coded form) the cosine and sine values to four binary places, and the fifth line represents the sign (i.e. plus or minus) of the values. While four binary places is preferable, more or less places can be provided. In the table of FIG. 5, I show the vector numbers in the second column, and the vector angles in the third column, both of which correspond to the diagram of FIG. 4. The cosine or X components are shown in the fourth column, and the sine or Y components are shown in the fifth column. When the latch circuit 33 produces, for example, the binary number 0011, this indicates the vector 4 at its angle of 67.5°. The cosine or X readout circuit 34X produces an output (preferably in binary code form) approximating +0.3827, and the sine or Y readout circuit 34Y produces an output (preferably in binary code form) approximating +0.9239. The readout circuits 34X, 34Y also produce the other X and Y components shown in FIG. 5 in response to the other binary inputs.

The outputs from the readout circuits 34X, 34Y are respectively applied to X and Y adding and damping circuits 35X, 35Y which add or subtract (depending on the sign) these outputs from the readout circuits 34X, 34Y, and keep a running total of these outputs. If the adding portions of the circuits 35X, 35Y had an unlimited capacity, their sums would continue to be added indefinitely. However, it is desirable to limit the sum, and this is best achieved by respective damping circuits. These damping circuits may take a number of forms, but I prefer that they reduce the readout circuit values being applied to the respective adding circuits by one-sixteenth of the total in the respective adding circuits. When the first value is provided by a readout circuit, the adding circuit has zero total, so the first value is added in full. When the second value is provided by a readout circuit, the adding circuit has the first total, so the second value is reduced by one-sixteenth of this first total, and the reduced second value added to provide the second total. Similarly, the third value is reduced by one-sixteenth of the second total and added to provide the third total. This process is continued until one-sixteenth of the total in the adding circuit is approximately equal to the value added. Subsequently, the total value in each of the adding and damping circuits 35X, 35Y represents an average of all previously added values. This damping arrangement is relatively easy to achieve in binary circuits, since a one-sixteenth part of a total can be obtained by shifting the four most significant numbers four places. This one-sixteenth part can then be subtracted from the value being added to leave a value that is damped or reduced (in this example to fifteen-sixteenths) in magnitude. If desired, the damping can be triggered by the pulse produced by the zero crossing of the tone. Damping can also be achieved by fractional multiplying arrangements. Or, in place of damping, it is possible to have an adding circuit which retains only a selected number of added values, usually the most recent.

The outputs of the X and Y adding and damping circuits 35X, 35Y thus provide an algebraic sum of the X and Y components of vectors representing the coincidence of a numbered pulse in a sequence and a point in the tone signal. The sign of these sums is not needed, so that only four outputs (each representing one place in a binary number) are provided in the remainder of the circuit. These components should be combined as $X^2 + Y^2$ to obtain their true resultant. However, persons skilled in the art will appreciate that squaring and square root functions are relatively difficult to achieve in an electronic circuit. I have found that a fairly close approximation of the resultant of X and Y vector components can be obtained by adding the full value of one component and half of the value of the other component. Accordingly, the output of the X adding and damping circuit 35X is divided by two in a divider 36X and applied to a Y resultant adding circuit 37Y along with the Y component from the Y adding and damping circuit 35Y. Similarly, the output of the Y adding and damping circuit 35Y is divided by two in a divider 36Y and applied to an X resultant adding circuit 37X along with the X component from the X adding and damping circuit 35X. The output of the X resultant adding circuit 37X is applied to an X threshold detector 38X which produces an output when its applied input exceeds some magnitude set by a threshold reference circuit 40. Similarly, the output from the Y resultant adding circuit 37Y is applied to a Y threshold detector 38Y having the same threshold reference magnitude. If either of the inputs to the X or Y threshold detectors 38X, 38Y exceed the reference, an output is produced and passed by an OR gate 41. This output can be applied to the audio amplifier 16 of FIG. 1 to activate the receiver.

Figure 6:
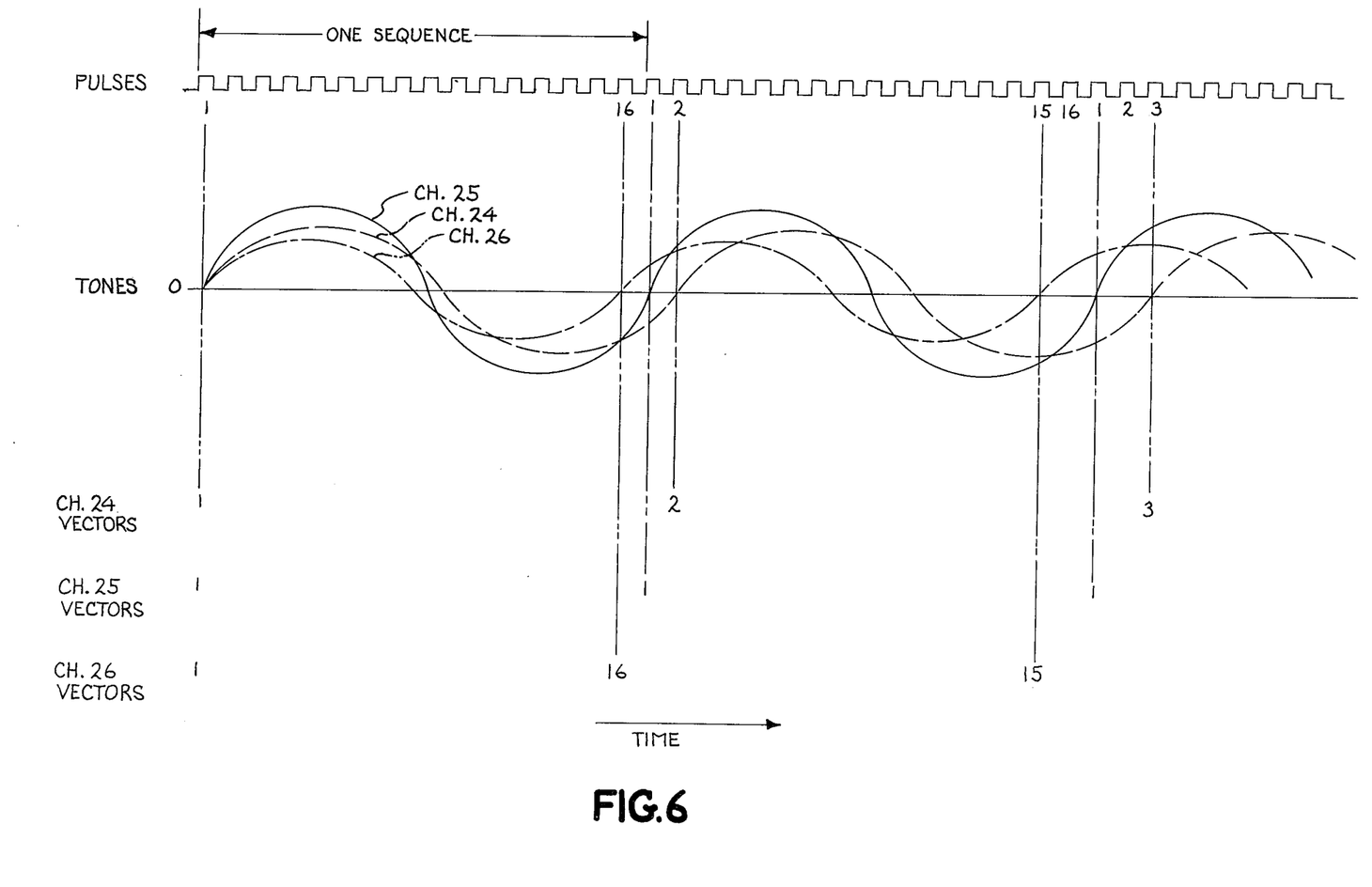
FIG. 6 shows several wave forms illustrating the operation of a tone frequency detecting circuit in accordance with my invention.
Figure 7A:
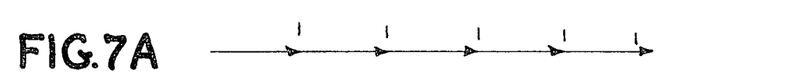
FIGS. 7A, 7B, and 7C show additional vector diagrams illustrating the operation of a tone frequency detecting circuit in accordance with my invention.
Figure 7B:
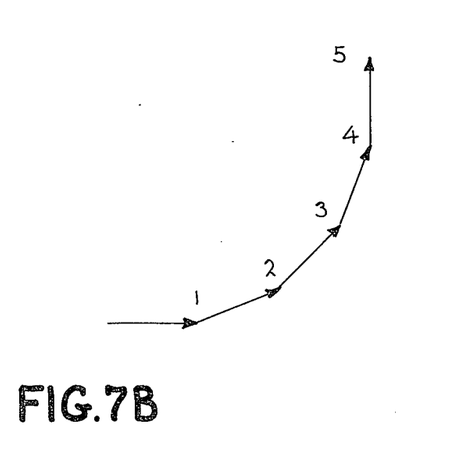
Figure 7C:
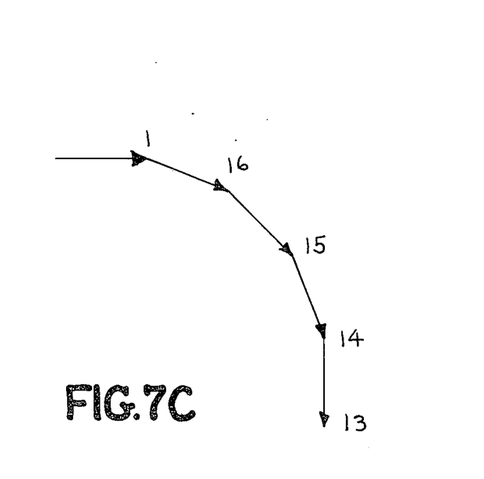

Operation of my detecting circuit can be further understood with reference to FIG. 6, which shows examples of waveforms plotted along a common time axis. In these examples, I have assumed that the receiver of FIG. 1 is arranged or intended to be activated in response to the 192.8 hertz tone of channel 25. Thus, 16 pulses must be produced for each cycle of tone frequency of 192.8 hertz. These pulses are shown at the top of FIG. 6, and the tone for channel 25 is indicated by the solid line wave form below these pulses. I have arbitrarily indicated that the first zero crossing of the channel 25 tone occurs at pulse number 1, so that X and Y components for vector 1 are produced by the X and Y adding and damping circuits 35X, 35Y. Of course, vector 1 has no Y component. Thus, only the X adding and damping circuit 35X produces outputs, and these outputs are added as shown by the vectors in FIG. 7A. When the resultant exceeds the threshold, the receiver is activated. In FIG. 6, I have also shown the tone for channel 24 in a dashed line, this being at the lower frequency of 186.2 hertz, and the tone for channel 26 in a dashed and dotted line, this being at a frequency of 203.5 hertz. (The tones for channels 24 and 26 are shown at smaller amplitudes to make the drawing clearer.) If it is assumed that the tone for channel 24 also has its first zero crossing at pulse 1, then the lower frequency for channel 24 will not have its next zero crossing until pulse 2 in the next sequence, and pulse 3 in the following sequency, and so on. This causes vectors 1, 2, 3, 4, and so forth to be produced in response to the sequences as illustrated in FIG. 7B. The higher frequency of channel 26 tone causes zero crossings at pulse 1, pulse 16, pulse 15, pulse 14, and so on, and these vectors are illustrated in FIG. 7C. It will be noted that the vectors of FIG. 7A have the largest resultant, indicating proper coincidence, and that the vectors for the lower and higher frequencies (shown in FIGS. 7B and 7C respectively) have decreasing resultants. Thus, if a relatively high threshold level is established, only a tone of the proper frequency will cause the resultant vector magnitude to exceed this threshold.

It will thus be seen that I have provided a new and improved tone frequency detecting circuit that is particularly well adapted to digital circuits, which are small and light. While I have shown my invention only in terms of a digital arrangement, it is to be understood that the circuit can also be provided in analog form only, or in combination as a digital and analog circuit. From the one digital embodiment of my invention described, persons skilled in the art will appreciate that modifications may be made. For example, a different number of pulses per phase or cycle of tone frequency may be utilized, although 16 pulses seems preferable. The X and Y damping circuits may take other forms than a circuit which reduces the total by one-sixteenth for each applied input, although the one-sixteenth reduction also seems a preferable and ideal arrangement. And, circuits for providing a true resultant magnitude of the vector components can be utilized in place of the approximation arrangement which I have shown in FIG. 3. Any selected threshold level representing any number of vector summations may be utilized.

Figure 8:
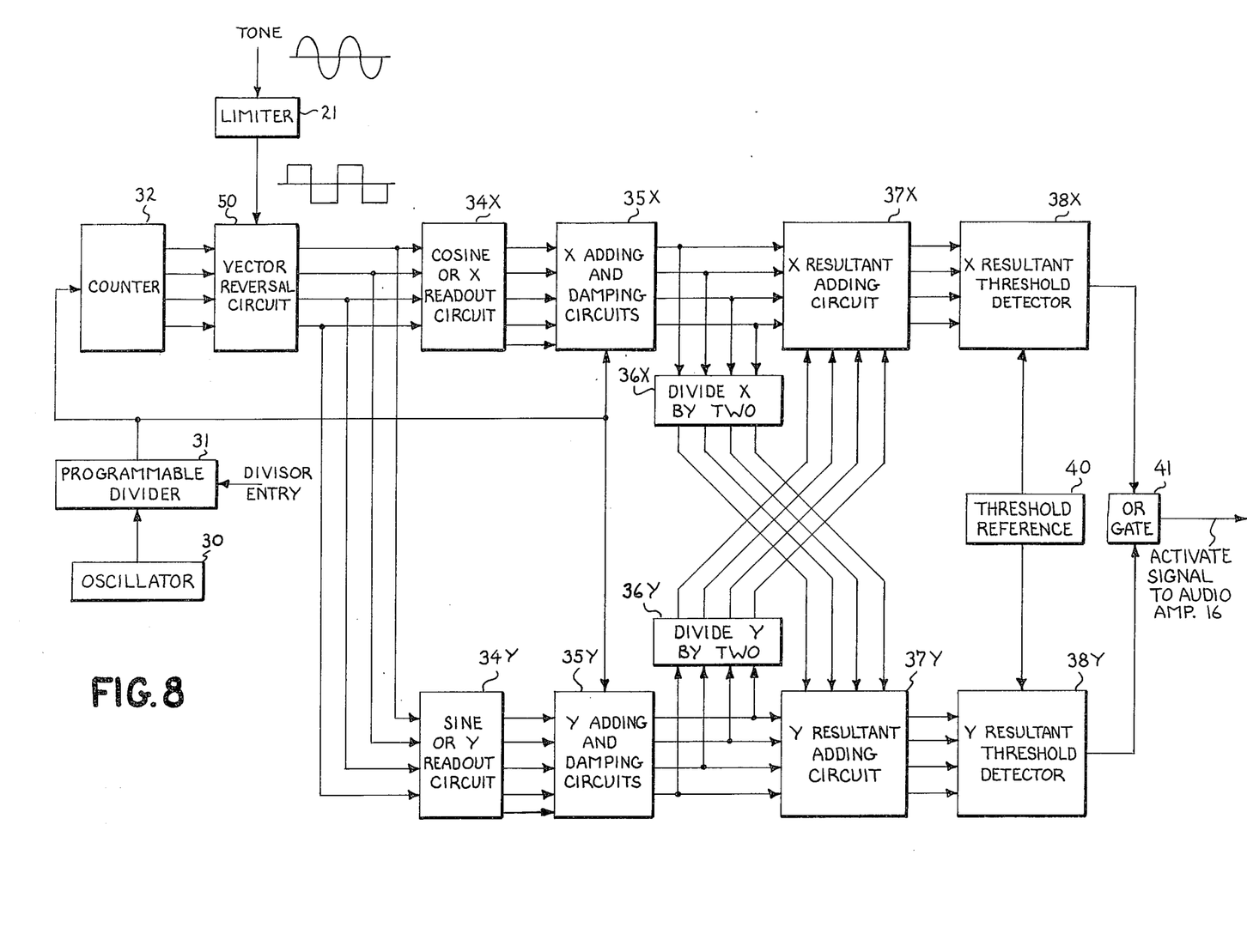
FIG. 8 shows a modification in accordance with my invention of the circuit of FIG. 3.

The tone marker pulse for determining the frequency of the tone can be replaced by a modification shown in FIG. 8. The modification of FIG. 8 is similar to the circuit shown in FIG. 3, and corresponding elements have been given the same reference numerals. However, in place of the latch circuit 33 of FIG. 3, I have substituted a vector reversal circuit 50 which operates on the output of the counter 32 in accordance with the output from the limiter 21 of FIG. 1. The vector reversal circuit 50 can take a number of known forms. One form is a memory circuit which, with reference to FIG. 9, would have a memory which produces the appropriate vectors in response to whether the signal produced by the limiter 21 were in the positive or negative half cycle. Thus, if the limiter output were in the positive half cycle, and if the counter 32 were producing vectors 1 through 8, the memory would simply cause vectors 9 through 16 to be produced. The memory would also function in a similar manner for the other three conditions shown in FIG. 9. A second form of a vector reversal circuit would be an EXCLUSIVE OR gate for the most significant input (i.e. the one representing 8) from the counter. As is well known in the art, an EXCLUSIVE OR gate has the following truth table:

| Input from Counter 32 | Input from Limiter 21 | Output to Readout Circuits 34X, 34Y |
|---|---|---|
| 0 | 0 | 0 |
| 1 | 0 | 1 |
| 0 | 1 | 1 |
| 1 | 1 | 0 |

Figure 9:
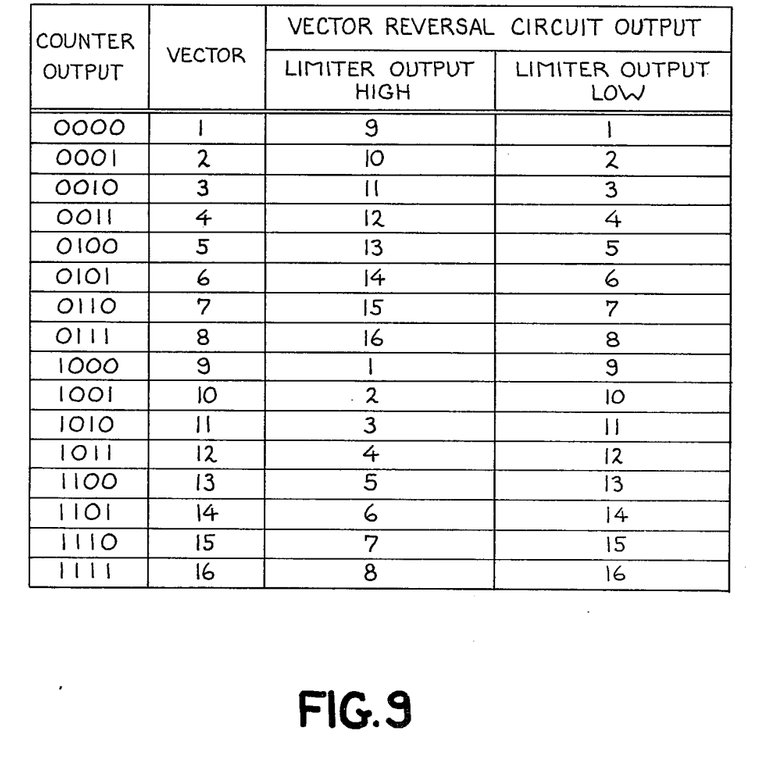
FIG. 9 shows a table illustrating the operation of the modification of FIG. 8.

In the above table, it will be seen that if the input from the limiter 21 is a logic 0, then the output of the EXCLUSIVE OR gate follows the input from the counter 32. However, if the limiter output is at a logic 1, then the EXCLUSIVE OR gate produces the logic inversion of the counter input. One input of the gate would be connected to the bit 8 output from the counter 32, the other input of the gate would be connected to the limiter 21, and the output of the gate would be connected to the readout circuits 34X, 34Y. The other counter outputs (representing 4, 2 and 1) would be connected directly to the readout circuits 34X, 34Y. Thus, the most significant bit (representing an 8) is inverted or not inverted as a function of the limiter output to provide the results shown in FIG. 9. The incoming tone is amplified and then limited to produce the square wave shown at the output of the limiter 21. The arrangement of FIG. 8 utilizes all 16 pulses produced by the counter during each cycle of desired tone. These pulses are passed directly or passed in reversed form depending upon which half cycle of tone is present, so that if the tone is of the proper frequency, the same eight count pulses are produced during each half cycle of tone. These pulses produce the corresponding vectors, so that the same eight vectors are produced during each half cycle of tone of the proper frequency. This arrangement provides a summation or averaging effect that may, in some instances, determine the tone frequency more accurately. FIG. 9 shows a table illustrating a selected operation of the vector reversal circuit 50. The first column of FIG. 9 shows the counter values from 1 through 16. The third and fourth columns show the vector reversal circuit output when the limiter output is high during each half cycle of tone and when the limiter output is low in alternate half cycles of tone. If it is assumed that the limiter output becomes low at the time of counter value 1, then the vector reversal circuit 50 produces counts 1 through 8 for counter values 1 through 8. At this time, the limiter output will then go high, so that the vector reversal circuit 50 produces counts 1 through 8 for counter values 9 through 16. Conversely, if the limiter output goes high at the time of counter value 1, then the vector reversal circuit produces counts 9 through 16 for counter values 1 through 8. When the limiter output goes low, the vector reversal circuit 50 produces counts 9 through 16 for counter values 9 through 16. Thus, with reference to FIG. 4, the same eight vectors are produced twice for counter values between 1 and 16. With reference to FIG. 8, I supply an advance pulse (which may be derived from the divider 31 with slight time delay) for each of the 16 counter values, so that the damping circuits 35X, 35Y and the remainder of the circuit produce 16 vectors for each full cycle of incoming tone. This produces a summing or total vector of fairly large magnitude relatively quickly, so that a good indication of tone frequency is provided. This arrangement does reduce the susceptibility of my circuit to noise, such as if the zero crossing described in connection with FIG. 3 is used to indicate the tone frequency. Persons skilled in the art will appreciate that the damping circuits 35X, 35Y of FIG. 8 may have different damping values than those contemplated for FIG. 3. And the threshold levels may be selected as desired.

Therefore, while my invention has been described with reference to particular embodiments, it is to be understood that modifications may be made without departing from the spirit of the invention or from the scope of the claims.

What I claim as new and desire to secure by Letters Patent of the United States is:

1. An improved circuit for detecting the frequency of an audio tone identification signal transmitted in a radio system, said improved circuit comprising:
   a. circuit input means adapted to be connected to said radio system for receiving said identification signal and producing a tone marker pulse in response to a selected time point in each cycle of said identification signal;
   b. a generator for producing N pulses during the time interval between each tone marker pulse and the next successive tone marker pulse;
   c. a coincidence circuit connected to said pulse generator and to said circuit input means for producing one of N coincidence signals in response to the simultaneous presence of one of said N generator pulses and a tone marker pulse respectively;
   d. vector generator means connected to said coincidence circuit for producing a predetermined vector signal in response to each of said N coincidence signals respectively;
   e. means connected to said vector generator means for producing a signal representative of a limited sum of said produced vector signals;
   f. and threshold means connected to said signal producing means for producing a circuit output signal in response to said representative signal exceeding a predetermined magnitude.

2. The improved circuit of claim 1 wherein said selected time point in each cycle of said identification signal is at every other zero crossing.

3. The improved circuit of claim 1 wherein said vector generator means produce X and Y components of said vector signals, wherein said signal producing means produce limited sums of said X and Y components, wherein said signal producing means further include a resultant adding circuit for said limited sums of said X and Y components, and wherein said threshold means are connected to said resultant adding circuit.

4. An improved circuit for detecting an identification signal of predetermined frequency comprising:
   a. first means for repetitively producing a sequency of N numbers at a sequence repetition frequency substantially equal to said predetermined frequency of said identification signal;
   b. second means responsive to said identification signal for producing signals indicative of the frequency thereof;
   c. a vector generator having a first input connected to said first means for said numbers and having a second input connected to said second means for said frequency indicative signals, said vector generator having at least one ouput for producing a vector signal in response to the simultaneous presence of any of said N numbers at said first input and any frequency indicative signal at said second input;
   d. each vector signal produced by said vector generator having a characteristic corresponding to the number present at said first input during its simultaneous presence with a frequency indicative signal at said second input;
   e. third means connected to said vector generator for summing the vector signals produced thereby and producing a resultant signal therefrom;
   f. and fourth means connected to said third means for producing a detection signal in response to said resultant signal exceeding a predetermined magnitude.

5. The improved circuit of claim 4 wherein each of said vector signals is characterized by a distinct angular position spaced 360°/N from adjacent vector signals.

6. The improved circuit of claim 4 wherein said third means further comprise means for reducing the magnitude of said vector signals a selected amount in response to each of said frequency indicative signals.

7. The improved circuit of claim 4 wherein said second means includes means for converting alternate half cycles of said identification signal into first and second frequency indicative signals respectively, wherein said vector generator can produce N different vector signals, wherein said vector generator produces a first half of said N vector signals in response to a first half of said numbers and said first frequency indicative signal, wherein said vector generator produces a second half of said N vector signals in response to said first half of said N numbers and said second frequency indicative signal, wherein said vector generator produces said second half of said N vector signals in response to a second half of said N numbers and said first frequency indicative signal, and wherein said vector generator produces said first half of said N vector signals in response to said second half of said N numbers and said second frequency indicative signal.

8. An improved circuit for detecting an identification signal of predetermined frequency comprising:
   a. first means for repetitively producing a sequency of N binary numbers at a sequence repetition frequency substantially equal to said predetermined frequency of said identification signal to be detected;
   b. second means responsive to said identification signal for producing signals indicative of the frequency thereof;
   c. a vector generator for producing a vector signal corresponding to each of said N binary numbers, said generator including: a first input connected to said first means, a second input connected to said second means, a first readout circuit for producing a first component of said vector signal in response to the simultaneous presence of any of said N binary numbers at said first input and any frequency indicative signal at said second input, and a second readout circuit for producing a second component of said vector signal in response to the simultaneous presence of any of said N binary numbers at said first input and any frequency indicative signal at said second input;

d. each first and second component of each vector signal produced by said vector generator having a characteristic corresponding to the binary number present at said first input during its simultaneous presence with a frequency indicative signal at said second input;

e. third means connected to said first and second readout circuits for respectively adding said first components and said second components produced thereby, and vectorially summing said added first components and said added second components;

f. and fourth means connected to said third means for producing a detection signal in response to vectorial sums exceeding a predetermined magnitude.

9. The improved circuit of claim 8 wherein each of said vector signals is characterized by a distinct angular position spaced 360°/N from adjacent vector signals.

10. The improved circuit of claim 8 wherein said third means further comprise means for reducing the magnitude of said added components a selected amount in response to each of said frequency indicative signals.

11. The improved circuit of claim 8 wherein said second means includes means for converting alternate half cycles of said identification signal into first and second frequency indicative signals respectively, wherein said vector generator can produce N different vector signals, wherein said vector generator produces a first half of said N vector signals in response to a first half of said N binary numbers and said first frequency indicative signal, wherein said vector generator produces a second half of said N vector signals in response to said first half of said N binary numbers and said second frequency indicative signal, wherein said vector generator produces said second half of said N vector signals in response to a second half of said N binary numbers and said first frequency indicative signal, and wherein said vector generator produces said first half of said N vector signals in response to said second half of said N binary numbers and said second frequency indicative signal.

* * * * *

UNITED STATES PATENT OFFICE
CERTIFICATE OF CORRECTION

PATENT NO. : 3,962,645

DATED : June 8, 1976

INVENTOR(S) : David A. Stewart

It is certified that error appears in the above-identified patent and that said Letters Patent are hereby corrected as shown below:

Col. 6, line 37, cancel "$X^2 + Y^2$" and insert -- $\sqrt{X^2 + Y^2}$ --

Col. 10, line 1 of Claim 4, cancel "sequency" and insert

-- sequence --

Signed and Sealed this

Nineteenth Day of October 1976

[SEAL]

Attest:

RUTH C. MASON
*Attesting Officer*

C. MARSHALL DANN
*Commissioner of Patents and Trademarks*